United States Patent [19]

Michaloski et al.

[11] Patent Number: 5,383,000
[45] Date of Patent: Jan. 17, 1995

[54] PARTIAL COHERENCE VARIER FOR MICROLITHOGRAPHIC SYSTEM

[75] Inventors: Paul F. Michaloski, Rochester; William N. Partlo, Fairport, both of N.Y.

[73] Assignee: General Signal Corporation, Stamford, Conn.

[21] Appl. No.: 981,051

[22] Filed: Nov. 24, 1992

[51] Int. Cl.6 ............................................. G03B 27/54
[52] U.S. Cl. ........................................ 355/67; 355/53; 355/70; 355/71
[58] Field of Search ................... 355/67, 70, 71, 53, 355/77

[56] References Cited

U.S. PATENT DOCUMENTS

| | | | |
|---|---|---|---|
| 4,851,882 | 7/1989 | Takahashi et al. | 355/67 |
| 4,988,188 | 1/1991 | Ohta | 355/67 |
| 5,014,086 | 5/1991 | Barry | 355/67 |
| 5,245,384 | 9/1993 | Mori . | |

Primary Examiner—Monroe H. Hayes
Attorney, Agent, or Firm—Eugene Stephens & Associates

[57] ABSTRACT

A microlithographic projection imaging system has an illuminator optical system and an objective imaging system, and an adjustable profiler or energy distributor in the illuminator optical system varies the numerical aperture of the illuminator, for varying the partial coherence of the projection imager. The adjustable profiler can be a diffuser, a binary optic, a hologram, or a fly's eye lens that is axially movable in a non-collimated region of the illumination path for imposing a predetermined angular profile on each of a multitude of fragments of the illumination. This changes the distribution of the illumination energy at the pupil of the illuminator and thus varies the numerical aperture and the angular energy profile of the illumination arriving at the objective imaging system, which is also preferably made uniform in spatial intensity by a uniformizer in the illuminator upstream of the pupil.

17 Claims, 8 Drawing Sheets

1

PARTIAL COHERENCE VARIER FOR MICROLITHOGRAPHIC SYSTEM

FIELD OF THE INVENTION

The improvement of this invention occurs in illumination systems for microlithographic projection imagers

BACKGROUND

It is sometimes desirable to vary the partial coherence of the illumination in a microlithographic projection imager. The partial coherence ($\sigma$) is a ratio formed of the numerical aperture of the illuminator optical system divided by the numerical aperture of the objective imaging system.

$$\sigma = \frac{NA \text{ illuminator}}{NA \text{ objective}}$$

Since the numerical aperture of the objective is generally fixed, the partial coherence ratio can best be varied by changing the numerical aperture of the illuminator optical system. This can be important when a phase shifting mask is used at the reticle plane of the objective imaging system.

The numerical aperture of the illuminator has been varied by changing the size of an aperture stop at the pupil of the illuminator optical system. This adjusts the size of the illumination beam passing through the illuminator pupil; but it blocks part of the illumination in the pupil region and reduces the illumination energy delivered to the objective imaging system, which has the disadvantage of slowing the machine down. The portion of the illumination energy that is blocked by an aperture stop at the illuminator pupil correspondingly reduces the illumination energy delivered to the image plane of the objective imaging system and correspondingly increases the imaging exposure time.

This invention devises a better way of adjusting the numerical aperture of the illuminator optical system, for varying the partial coherence, while substantially preserving the illumination energy so that imaging exposure times are not increased. The inventive way of adjusting partial coherence can be made more convenient than changing an aperture stop at the illuminator pupil and can be arranged to be made at the keyboard of a computer controlling functions of the projection imager.

SUMMARY OF THE INVENTION

The inventive way of adjusting partial coherence involves moving a component or member of the illuminator optical system. The movable member is an illumination energy distributor, preferably in a form that imposes a predetermined angular profile on each of a multitude of fragments of the illumination. This member is also arranged upstream of the pupil of the illuminator optical system in a region where the illumination is non-collimated. Movement of the energy distributor or profiler then illuminates different size regions of the profiler and thus changes the size of the illumination beam throughout which the distributor imposes its predetermined angular profile. In other words, movement of the partial coherence adjusting member changes the energy distribution of the illumination at the pupil of the illuminator optical system, thereby changing the numerical aperture of the illuminator and also varying the partial coherence. In effect, the movable energy distributor becomes a secondary or surrogate source that is variable in size and brightness, without varying the uniformity or size of the illuminated region at the image plane.

A uniformizer, which is a generally known device, is preferably arranged between the movable profiler and the illuminator pupil; and the uniformizer divides the illumination into segments and rearranges these to ensure that the illumination is uniform throughout the illuminated area. This allows the partial coherence adjustment to vary the energy distribution at the illuminator pupil without varying the uniformity of the spatial intensity of the illumination at the image plane of the objective imaging system. In other words, the numerical aperture adjuster can change the angular energy profile of the illumination at the reticle and wafer planes of the objective imaging system (i.e., vary the partial coherence) without varying the uniformity of the spatial intensity or the brightness of the illumination at these regions.

DRAWINGS

Figure 3A:
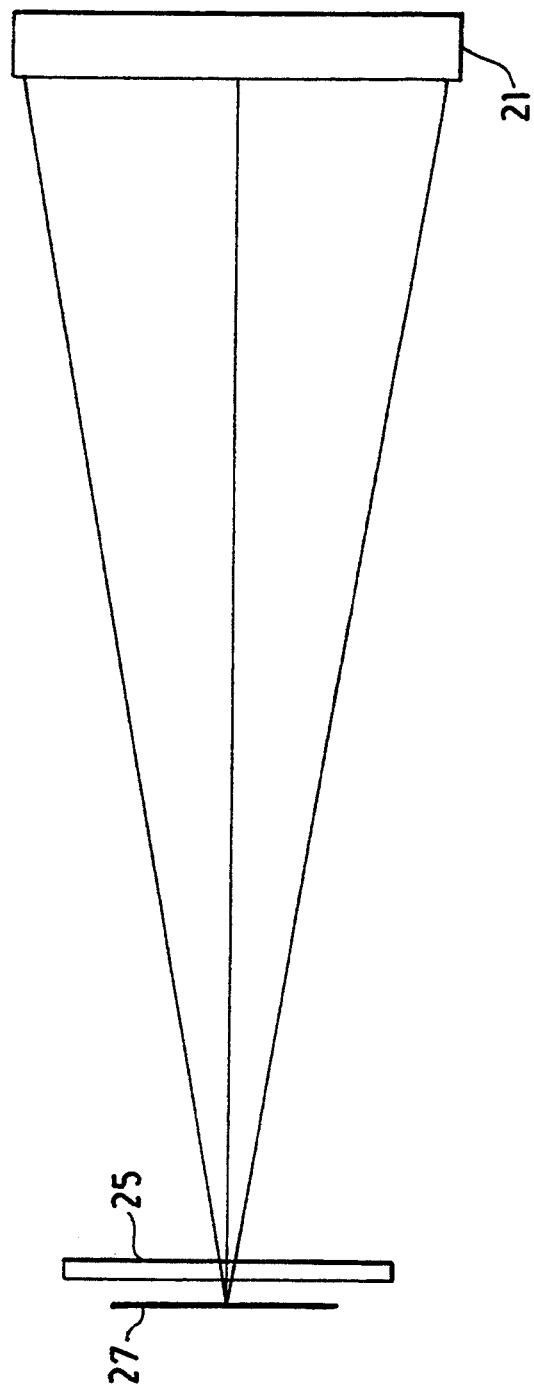

FIGS. 3A, B, and C; 4A, B, and C; and 5A, B, and C are corresponding views of the effect of partial coherence adjustment of the inventive illuminator, showing in the A views the effect of axial movement of an angular profiler in the illumination beam of the illuminator, showing in the B views a schematic plan view of the corresponding effect on the energy distribution of the illumination at the illuminator pupil, and showing in the C views a perspective view of the illumination energy distribution effect.

DETAILED DESCRIPTION

Figure 1:
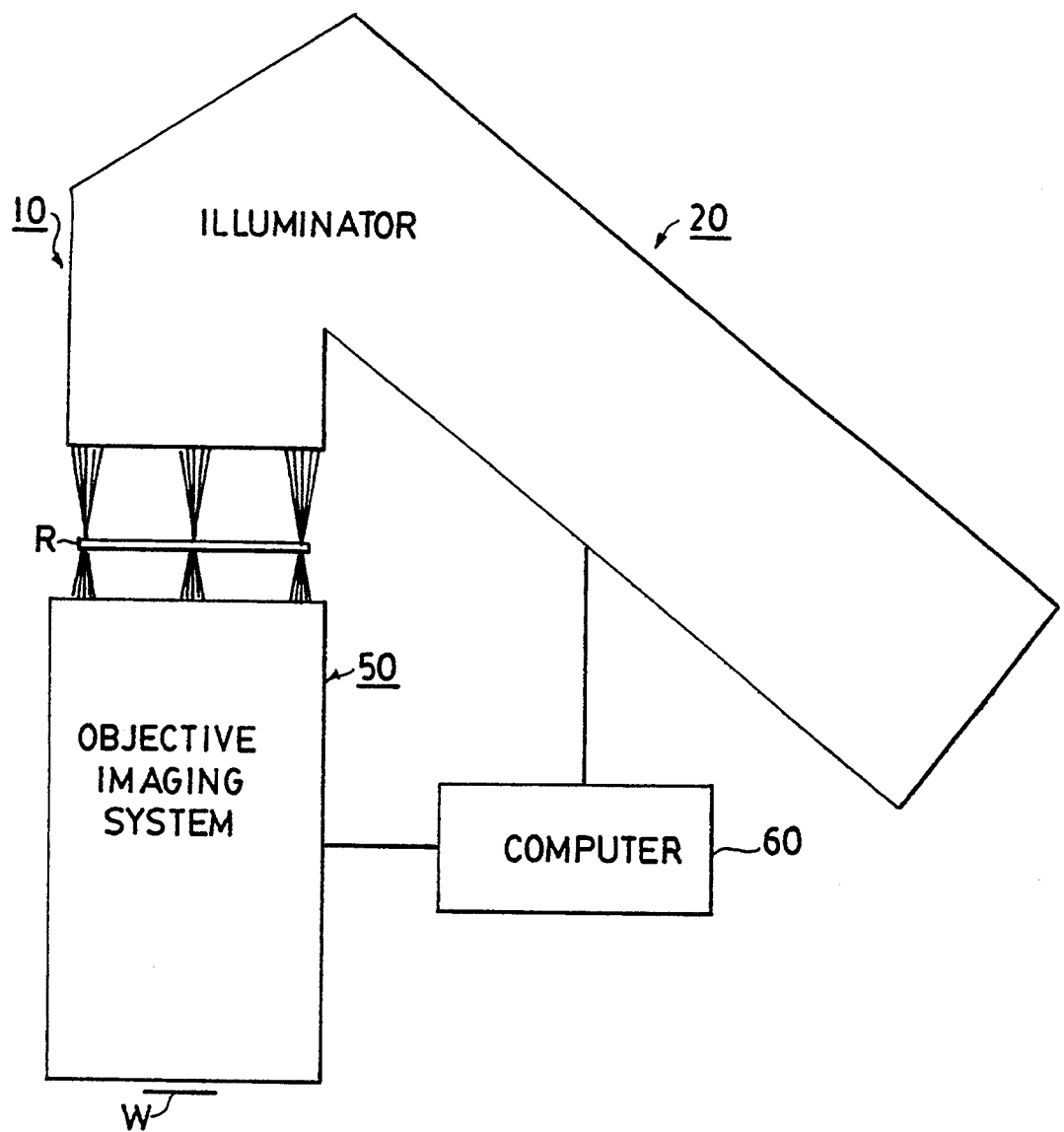
FIG. 1 is a schematic diagram of a microlithographic projection imager including an objective imaging system and an illuminator optical system capable of varying partial coherence according to the invention.

A microlithographic projection imager 10 suitable for the inventive partial coherence varier is schematically illustrated in FIG. 1. It includes an illuminator 20 and an objective imaging system 50, both preferably controlled by a computer 60. Light or radiation from a source not indicated is directed through an optical system of illuminator 20 to a reticle plane R where a mask or reticle to be imaged is positioned. Illumination passing through a mask at reticle plane R proceeds through objective imaging system 50 to wafer plane W where the mask is imaged by the transmitted illumination.

Projection imaging can vary with the masks or reticles involved, and different masks can especially benefit from different partial coherences. For example, phase shifting masks or reticles generally need lower partial coherence values, and standard masks or reticles generally need higher partial coherence values. Also, making the partial coherence of the projection imager readily variable allows it to be empirically optimized for any given mask or reticle. To meet these needs, the invention provides a way of making the numerical aperture of the optical system of illuminator 20 readily adjustable. Instead of making such adjustments by changing the size of an aperture stop at the pupil of illuminator 20, which can waste some of the illumination, this invention proposes an improved way of varying partial coherence.

Figure 2:
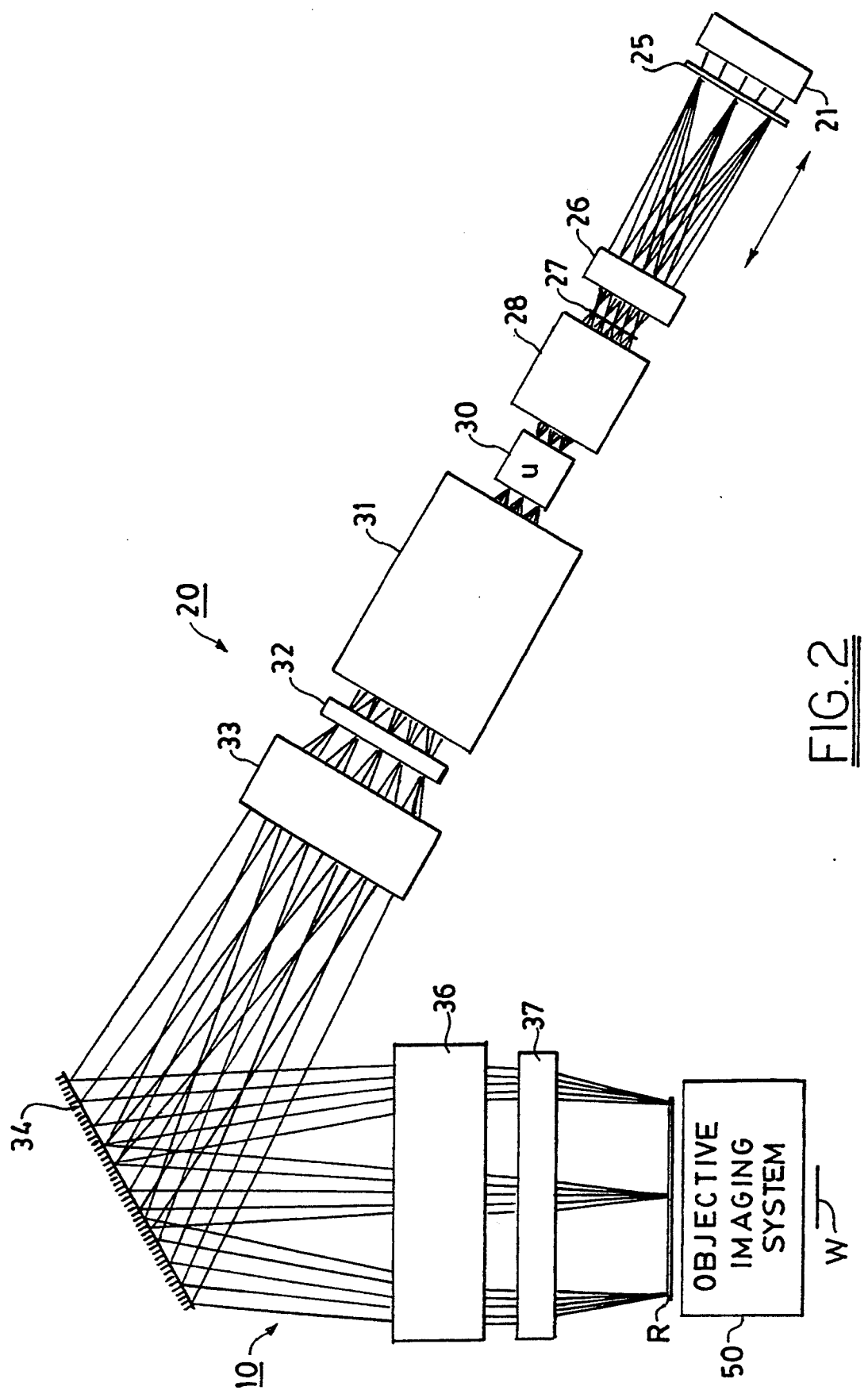
FIG. 2 is a schematic diagram of preferred members of an illuminator optical system that can vary the partial coherence according to the invention.

A portion of the optical system of illuminator 20 is schematically illustrated in FIG. 2 to show a preferred way of varying the partial coherence by changing the numerical aperture of the illuminator according to the invention. Member 21 schematically represents a source of radiation and a generally known system of lenses for delivering illumination to the downstream members of illuminator 20. The elements represented by member 21 are generally known and preferably not involved in varying partial coherence according to the invention.

A series of preferred members of illuminator 20 are arranged downstream of member 21, as shown in FIG. 2. The most important of these, for purposes of this invention, is partial coherence varier 25, which is movable axially of the optical axis of illuminator 20, along the illumination path, as schematically illustrated by the double-ended arrow. Partial coherence varier 25 can also be thought of as an illumination energy distributor or as an illumination angular profiler, and these terms are used interchangeably in the following description.

Downstream of varier 25, whose operation will be explained, is preferably a lens or lens group 26, a reference plane 27 downstream of member 26, another lens or lens group 28, and a uniformizer 30. Members 26 and 28 can be varied considerably according to generally known optical design. Uniformizer 30 is preferably a kaleidoscopic rod, but can also be a fly's eye lens formed of an array of a multitude of tiny lenses. It segments the illumination and rearranges the segments to ensure uniform intensity of the illumination throughout the illuminated field.

Member 31, formed of another lens or lens group, is between uniformizer 30 and iris 32, which is preferably arranged at the pupil of illuminator 20. Downstream of iris 32 is preferably another lens or lens group 33, a folding mirror 34, and two final members 36 and 37, also formed of lenses or lens groups that direct the illumination to reticle plane R, where a mask is positioned, so that the illumination passes through objective imaging system 50 and images the mask at wafer plane W.

Partial coherence adjuster 25 imposes a predetermined angular profile on each of a multitude of fragments of the illumination from member 21 so that any point of such illumination entering adjuster 25 emerges as a cone of illumination having the predetermined angular profile. This can be done by forming adjuster 25 as a diffuser constructed to distribute incident illumination in a predetermined angular profile. This differs from merely converging or diverging the illumination beam, because each fragment of the incident illumination is given the same outgoing angular profile, as schematically illustrated by the ray tracings in FIG. 2. Elements other than a diffuser can also impose a predetermined angular profile on each of a multitude of fragments of the illumination; and these include a binary optic element, a hologram, and a fly's eye lens formed of a closely packed array of a multitude of tiny lenses.

Adjuster 25 is positioned in a region where the incident illumination from member 21 is non-collimated. This can include converging or diverging illumination and happens to be converging illumination in the preferred embodiment illustrated in FIG. 2. An effect of the illumination incident on adjuster 25 being non-collimated is that axial movement of adjuster 25 illuminates different size regions of adjuster 25. Since the illumination incident on adjuster or distributor 25 is given a predetermined angular profile, regardless of the size of the illuminated area of distributor 25, then axial movement of distributor 25 makes it an effective illumination source of variable size. Distributor or adjuster 25 can thus be viewed as a secondary or surrogate source of the illumination originating in member 21, the secondary source being variable in size as adjuster 25 moves axially, and the secondary source having a predetermined angular profile, regardless of its effective size.

The angular profiled illumination from energy distributor 25 passes through member 26 and appears at reference plane 27, where the energy distribution of the illumination is conjugate to the enveloping energy distribution of the illumination at the pupil of illuminator 20, where adjustable iris 32 is located. Thus, the energy distribution of the illumination at plane 27 is similar to the enveloping energy distribution of the illumination at pupil 32, and variation in the illumination energy distribution at the pupil and at plane 27 is made possible by adjusting profiler 25 to change the numerical aperture of illuminator 20 and thus change the partial coherence of the microlithographic projection imager 10.

Figure 3B:
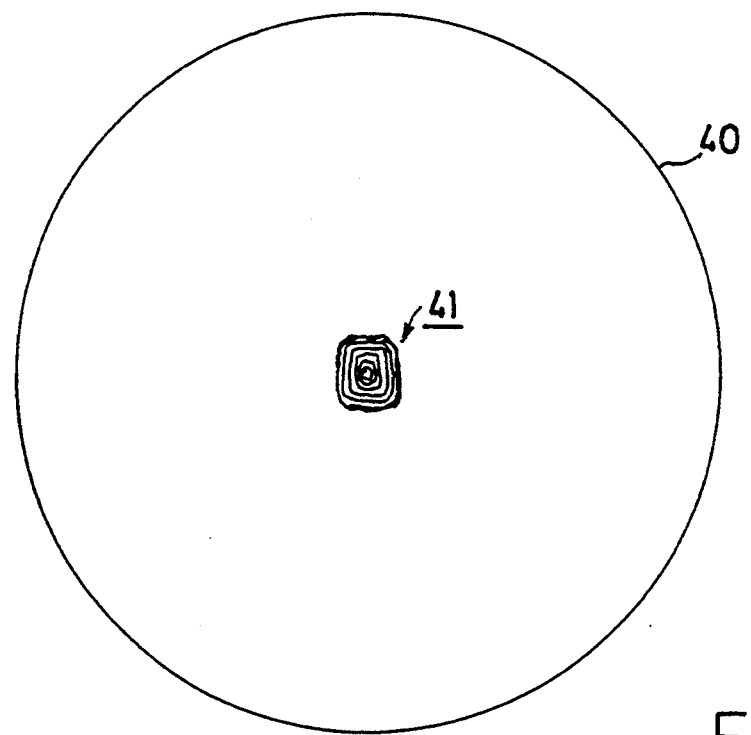
Figure 3C:
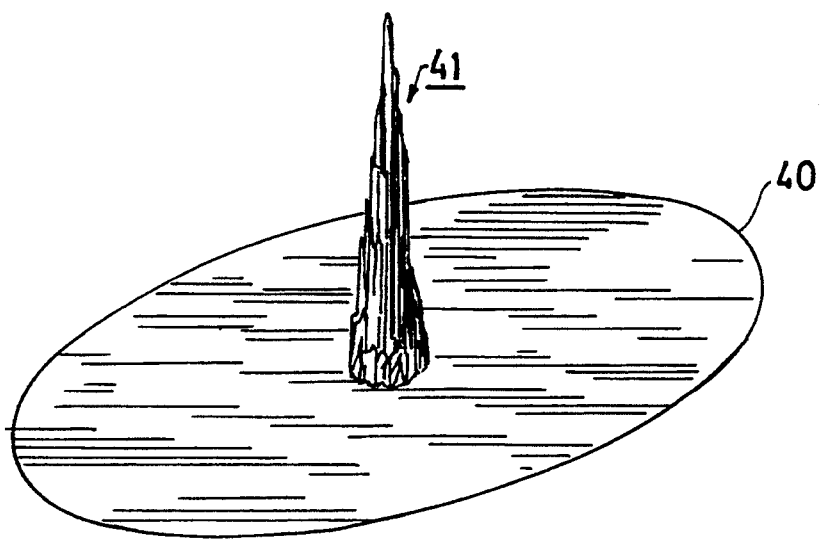

The way adjuster 25 accomplishes this is best shown in FIGS. 3-5, which omit member 26 and use reference plane 27 as a substitute for the illuminator pupil, for simplicity of illustration. Profiler 25 is at the narrow or small numerical aperture end of its adjustment range as schematically shown in FIG. 3A, where converging illumination from member 21 illuminates a tiny area of profiler 25, which delivers a correspondingly small or narrowly profiled beam to reference plane 27. The effect on the energy distribution of the illumination is shown in FIGS. 3B and 3C, which represent the enveloping illumination energy distribution at the pupil region of illuminator 20. FIGS. 3B and 3C show that over a total possible pupil illumination area 40, the energy distribution of the illumination beam is concentrated in a central region 41, giving the illumination a small numerical aperture.

Figure 4A:
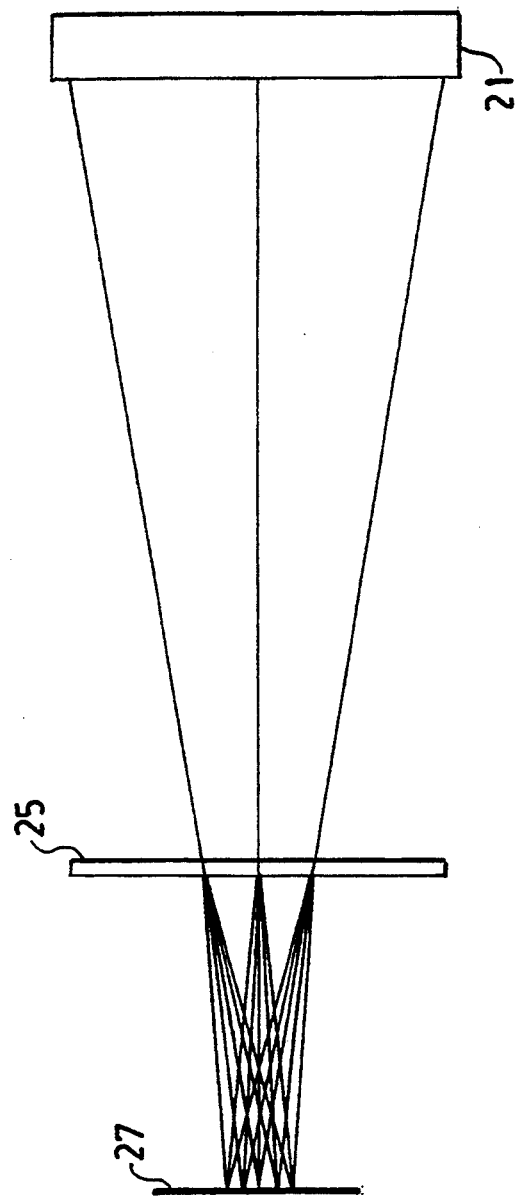
Figure 4B:
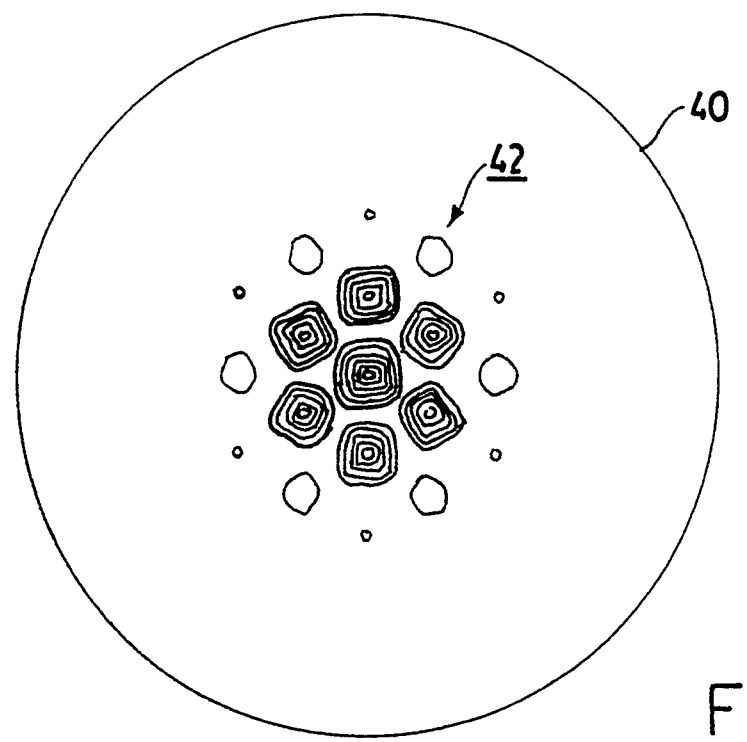
Figure 4C:
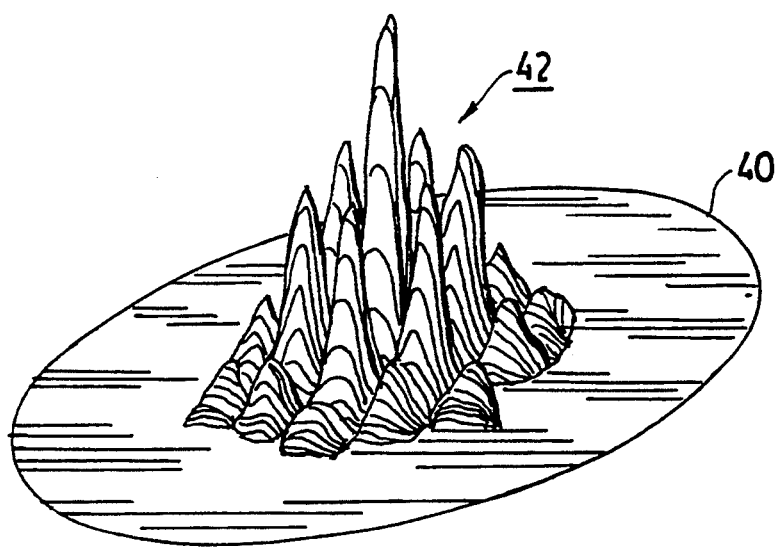

An intermediate position of profiler 25 is shown in FIG. 4A, where a larger area of profiler 25 is illuminated, and the predetermined angular profile of cutout illumination falls on a larger area of reference plane 27 and the illuminator pupil. The effect of this is shown by the illumination energy concentration in a central region 42 of the total pupil illumination region 40, as illustrated in FIGS. 4B and 4C. This produces an intermediate numerical aperture.

Figure 5A:
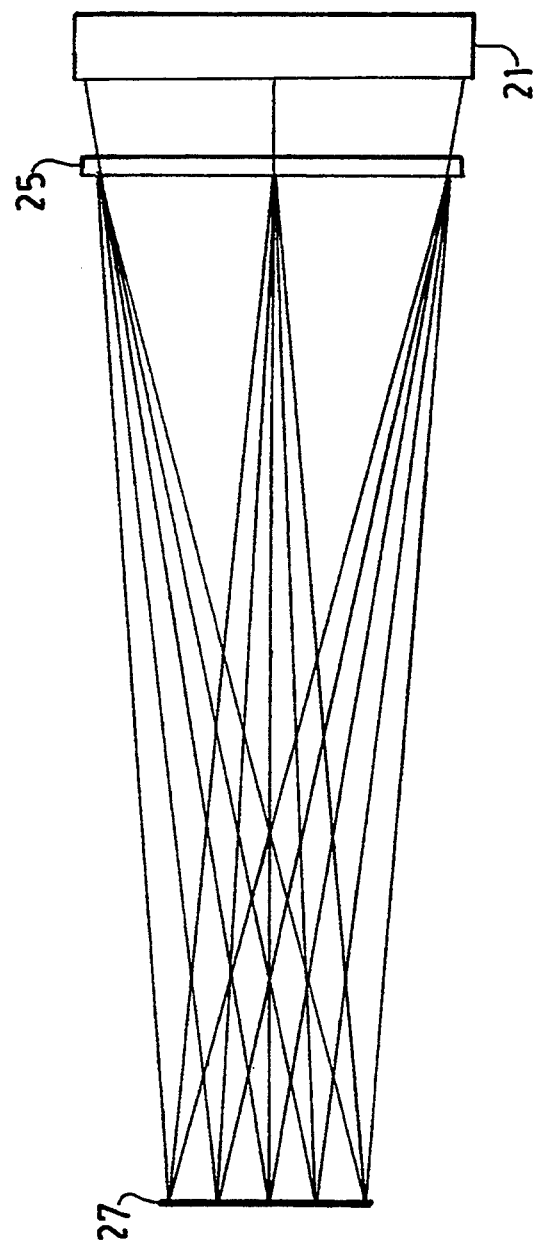
Figure 5B:
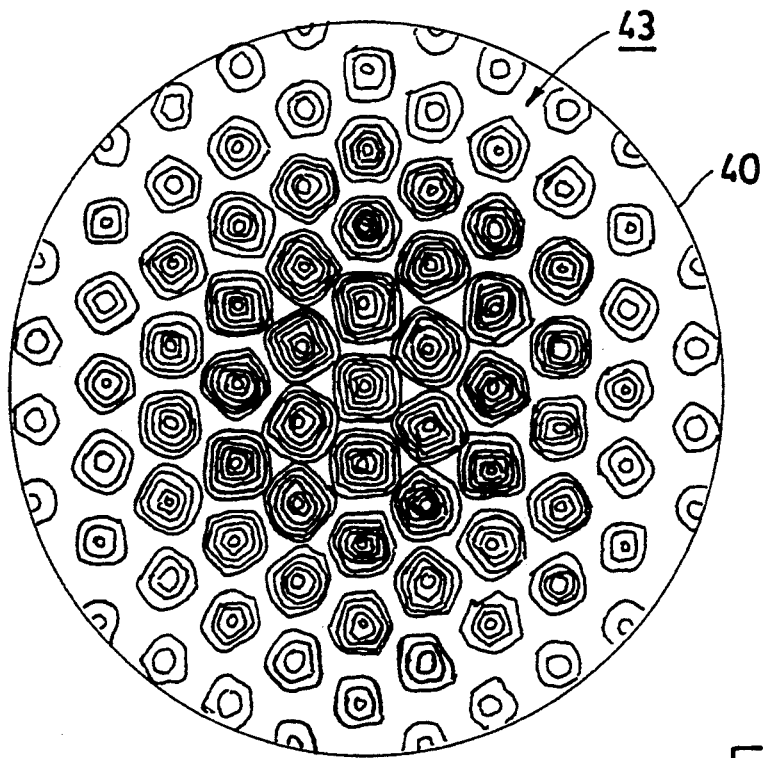
Figure 5C:
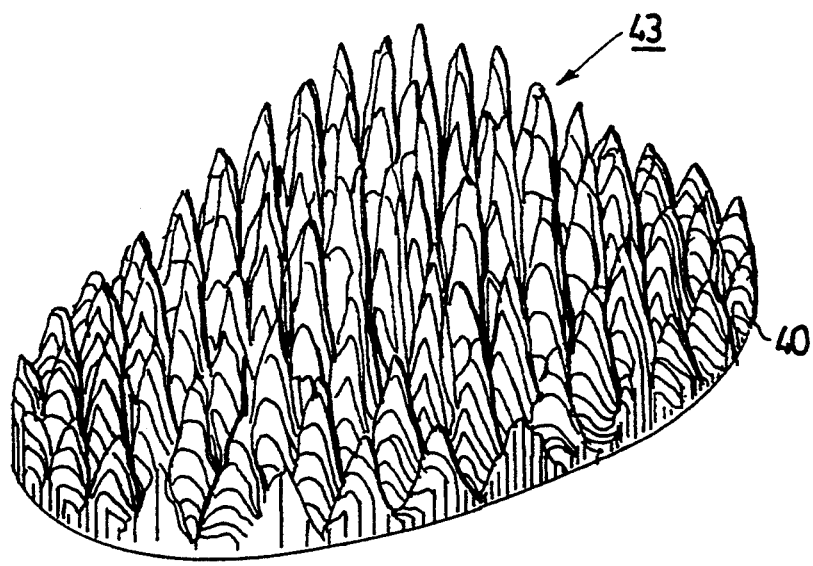

The broad or large numerical aperture position of profiler 25 is shown in FIG. 5A, where a maximum area of profiler 25 is illuminated by energy from member 21. The predetermined angular profile imposed on the illumination by energy distributor 25 in turn illuminates a large area of reference plane 27 and the pupil region of illuminator 20. The effect of this is the widely distributed illumination 43 extending throughout the pupil illumination region 40, as shown in FIGS. 5B and 5C.

The energy distribution of the illumination at the pupil region of illuminator 20 effectively varies the numerical aperture and the partial coherence. Iris 32 can be adjusted to correspond to the numerical aperture and transmit a predetermined portion of the illumination energy, without waste. For example, when the illumination energy is concentrated in the center 41 of the illumination region 40, as shown in FIGS. 3B and 3C, iris 32 can be stopped down to a smaller aperture opening passing most of the illumination and trimming only the edges. Conversely, when the illumination energy is widely distributed as shown in FIGS. 5B and 5C, iris 32 can be correspondingly opened to pass a desired portion of the more widely distributed illumination energy. The total energy of the illumination transmitted through pupil 32 can be kept constant, even though iris 32 is adjusted to different sizes. Constant total energy ensures that exposure times and machine cycle speed remain constant. Iris 32 can be adjusted along with distributor 25, and these adjustments can be made by computer 60.

The narrow concentration or more wide distribution of the illumination energy at the pupil region of illuminator 20 establishes the numerical aperture, the partial coherence, and the angular energy profile of the illumination reaching reticle plane R and wafer plane W. The spatial intensity of the illumination at planes R and W is made uniform, however, by the effect of uniformizer 30, arranged upstream of the illuminator pupil. The segmenting and rearranging of the illumination by uniformizer 30 ensures uniformity throughout the illumination field, even though the angular energy profile of the illumination arriving at the illumination field is varied by moving adjuster 25. In effect, the optical members downstream of profiler 25 image profiler 25 at planes R and W, which are conjugate to each other. The size of the illumination field at planes R and W can remain constant, and the intensity of the illumination throughout the illuminated regions at planes R and W can remain uniform while the angular energy profile of the illumination arriving at planes R and W varies according to the adjusted position and effective source size of profiler 25. If you could occupy a position on reticle plane R, you would be uniformly illuminated anywhere within the illuminated field; and if you could look upstream into illuminator 20 from plane R, you would see an array of a multitude of bright spots formed by uniformizer 30, with the number and brightness of these spots being determined by the adjustment of profiler 25.

Overfilling of uniformizer 30 can occur with axial shifts of profiler 25. If the filling of uniformizer 30 becomes a problem, from such adjustments, this can be compensated for by adjusting upstream optical members to refocus the illumination energy on the input of uniformizer 30.

We claim:

1. A partial coherence varier for a microlithographic projection imaging system including an illuminator having an illuminator optical system directing illumination to an objective imaging system, said partial coherence varier comprising:
   a. an illumination energy distributor arranged in said illuminator optical system;
   b. said energy distributor being structured for imposing a predetermined angular profile on each of a multitude of fragments of said illumination;
   c. said energy distributor being arranged for movement axially of said illuminator optical system upstream of a reference plane of said illuminator optical system;
   d. a uniformizer arranged downstream of the energy distributor and the reference plane;
   e. the illuminator optical system having a pupil downstream of the uniformizer;
   f. the optical system of the illuminator being arranged so that the reference plane is conjugate with the pupil; and
   g. axial movement of said energy distributor being arranged for varying the area of the energy distribution of said illumination at said pupil for varying the numerical aperture of said illuminator optical system and thereby varying said partial coherence without varying illumination uniformity or field size.

2. The partial coherence varier of claim 1 including an adjustable iris arranged at said pupil of said illuminator optical system.

3. The partial coherence varier of claim 1 including computer control of said movement of said energy distributor.

4. The partial coherence varier of claim 1 wherein said axial movement of said energy distributor is arranged for varying the size of an illuminated area of said energy distributor.

5. The partial coherence varier of claim 1 wherein said energy distributor is arranged in a region of converging illumination.

6. The partial coherence varier of claim 1 wherein said energy distributor is a diffuser.

7. The partial coherence varier of claim 1 wherein said energy distributor is a binary optic.

8. The partial coherence varier of claim 1 wherein said energy distributor is a hologram.

9. The partial coherence varier of claim 1 wherein said energy distributor is a multiple refractive element.

10. In an optical system of an illuminator directing illumination to an objective imaging system for a microlithographic projection imager, a varier for the numerical aperture of said illuminator optical system for varying the partial coherence of said microlithographic projection imager, said varier comprising:
    a. an energy profiler arranged for imposing a predetermined angular profile on each of a multitude of fragments of said illumination;
    b. said energy profiler being arranged upstream of a pupil of said illuminator optical system for movement along an optical axis of said illuminator optical system in a region where said illumination is non-collimated;
    c. a uniformizer arranged between the energy profiler and the pupil;
    d. lens elements of the illuminator optical system being arranged between the uniformizer and the pupil;
    e. lens elements of the illuminator optical system being arranged between the energy profiler and the uniformizer; and
    f. said energy profiler being arranged so that movement along said optical axis illuminates variable size regions of said energy profiler and thereby varies the energy distribution area of illumination at said pupil, to vary said numerical aperture and said partial coherence without varying uniformity or field size of the illumination as an image plane.

11. The varier of claim 10 wherein an adjustable iris is arranged in a region of said pupil.

12. The varier of claim 11 including computer control of the movement of said energy profiler and said adjustable iris.

13. The varier of claim 10 wherein said illumination in a region of movement of said energy profiler is converging toward said uniformizer.

14. The varier of claim 10 wherein said energy profiler is a diffuser.

15. The varier of claim 10 wherein said energy profiler is a binary optic.

16. The varier of claim 10 wherein said energy profiler is a hologram.

17. The varier of claim 10 wherein said energy profiler is a multiple refractive element.

* * * * *